(12) United States Patent
Liu

(10) Patent No.: US 6,501,123 B2
(45) Date of Patent: Dec. 31, 2002

(54) HIGH GATE COUPLING NON-VOLATILE MEMORY STRUCTURE

(75) Inventor: Chen-Chin Liu, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 39 days.

(21) Appl. No.: 09/878,897

(22) Filed: Jun. 11, 2001

(65) Prior Publication Data

US 2002/0125520 A1 Sep. 12, 2002

(30) Foreign Application Priority Data

Mar. 6, 2001 (TW) ........................................ 090105104

(51) Int. Cl.<sup>7</sup> ............................................. H01L 29/788
(52) U.S. Cl. ........................................ 257/315; 257/321
(58) Field of Search .................................. 257/315, 321

(56) References Cited

U.S. PATENT DOCUMENTS 6,207,500 B1 * 3/2001 Hu et al.
6,323,635 B1 * 5/2002 Wang et al.
6,384,450 B1 * 5/2002 Hidaka et al.
6,448,609 B1 * 9/2002 Higashitani et al.

FOREIGN PATENT DOCUMENTS

| EP | 0166208 A2 | * | 6/1984 |
| EP | 0144900 A2 | * | 6/1985 |
| GB | 2165991 A | * | 4/1986 |

* cited by examiner

Primary Examiner—Stephen D. Meier
(74) Attorney, Agent, or Firm—J.C. Patents

(57) ABSTRACT

A non-volatile memory structure having a higher gate-coupling ratio. The structure includes a substrate, shallow trench isolation layers, buried source/drain terminals, tunnel oxide layers, a floating gate with a three-dimensional structure, dielectric layers and a control gate. A portion of the floating gate is located inside an opening in the dielectric layer so that a three-dimensional structure formed. Since the subsequently formed control gate has a larger effective surface area, a higher gate-coupling ratio is obtained.

11 Claims, 6 Drawing Sheets

HIGH GATE COUPLING NON-VOLATILE
MEMORY STRUCTURE

CROSS-REFERENCE TO RELATED
APPLICATION

This application claims the priority benefit of Taiwan application serial no. 90105104, filed Mar. 6, 2001.

BACKGROUND OF THE INVENTION

1. Field of Invention

The present invention relates to a memory structure. More particularly, the present invention relates to a non-volatile memory structure having a high gate-coupling ratio.

2. Description of Related Art

In integrated circuit applications, erasable and programmable read only memory (EPROM), electrically erasable programmable read only memory (EEPROM) and flash memory are commonly used non-volatile memories. Each of these non-volatile memories utilizes the application of a positive or a negative voltage to its control gate to control the injection of charges into the floating gate or the removal of charges from the floating gate. Data is stored as electric charges inside the memories. Hence, data is retained even if power source for driving the memory is cut.

In general, most gate structures of a non-volatile memory unit has a stacked gate design that includes a floating gate for holding electric charges, an oxide-nitride-oxide (ONO) structure serving as a dielectric layer and a control gate form controlling data access. The memory unit utilizes either hot carrier effect or tunneling effect to drive electric charges into the floating gate of the stacked gate structure so that a logic '0' or '1' is represented. To change the data inside the memory, a reverse voltage is applied to the control gate so that the accumulated charges inside the floating gate are channeled away.

Among the conventional non-volatile memory structures, the so-called twin cell design is quite common. FIGS. 1A through 1D are schematic cross-sectional views showing the progression of steps for forming the stacked gate of a conventional twin cell non-volatile memory unit. As shown in FIG. 1A, a semiconductor chip 10 that includes a silicon substrate 12 is provided. A pair of shallow trench isolation (STI) structures 14 are formed in the substrate 12. A thermal oxidation layer (not shown), a polysilicon layer (not shown) and a silicon nitride layer (not shown) are sequentially formed over the silicon substrate 12. After performing a photolithographic and etching process, a pair of tunnel oxide layers 16, a pair of polysilicon layers 18 and a pair of silicon nitride layer 20 are formed.

As shown in FIG. 1B, an ion implantation of the substrate 12 is conducted while using the silicon nitride layer 20 and the pair of STI layers 14 as a mask. A high-temperature oxidation treatment is carried out to activate the doped ions, thereby forming a pair of ion-doped layers 22 at a pre-determined depth to serve as a drain terminal and a source terminal, respectively. In the meantime, a thermal oxidation layer 24 is formed over each ion-doped layer 22. Hence, one ion-doped layer 22 of the pair forms a buried drain (BD) while the other ion-doped layer 22 forms a buried source (BS) respectively.

As shown in FIG. 1C, the silicon nitride layer 20 is completely removed. A pair of polysilicon layers 26 are formed in pre-defined regions above the semiconductor chip 10. Each polysilicon layer 18 and its overlying polysilicon layer 26 together form a floating gate 28 of the non-volatile memory unit.

As shown in FIG. 1D, an oxide-nitride-oxide (ONO) structure, serving as a dielectric layer 30, is formed over the silicon substrate 12. The ONO structure is a composite layer. Finally, a control gate 32 is formed over the silicon substrate 12. The control gate 32 covers the dielectric layer 30 within the pre-defined regions and the thermal oxidation layers 24.

The floating gate 28, the dielectric layer 30 and the control gate 32 together form the stacked gate 34 of a non-volatile memory unit. The pair of floating gates 28 between the pair of field oxide layer is a pair of storage units of the twin-cell structure. When a high voltage is applied to the control gate 32 of the stacked gate 34, carrier multiplication occurs at the junction between the drain terminal 22 and the silicon substrate 12 leading to the generation of hot electrons. A portion of the hot electrons is driven past the tunnel oxide layer 16 into the floating gate 28 so that the floating gate 28 is negatively charged. Such negative charges are trapped inside the floating gate 28 due to the surrounding dielectric layer 30 and the tunnel oxide layer 16. This completes a data input operation.

Because the conventional process uses a high-temperature oxidation step to form the thermal oxide layers 24, a bird's beak structure is formed at each end of the thermal oxide layer 24. This leads to a variation of thickness in the thermal oxidation layer 24 in addition to lattice structure damages near the surface of the silicon substrate 12. Ultimately, reliability of the twin-cell unit is greatly affected. Furthermore, dimensions of a device are severely limited by the thermally formed oxide layer 24.

In addition, the high-temperature process may also over-drive ions into the drain terminal and the source terminal 22, leading to a shortening of channel length underneath the tunnel oxide layer 16. This will increase the frequency of punchthrough between the drain terminal and the source terminal. Consequently, electrical properties of the twin-cell unit may be severely affected, resulting in a lowering of the yield rate in the production process.

SUMMARY OF THE INVENTION

Accordingly, one object of the present invention is to provide a non-volatile memory structure having a higher gate-coupling ratio. The structure includes a substrate having a pair of shallow trench isolation (STI) layers, a pair of tunnel oxide layers, a pair of buried source/drain regions, a first dielectric layer, a pair of floating gates, a second dielectric layer and a control gate. The pair of tunnel oxide layers is formed on the upper surface of the substrate between the STI layers. The buried source/drain regions are formed within the substrate between the STI layers and the tunnel oxide layers. The first dielectric layer is formed above the substrate covering the buried source/drain regions. The first dielectric layer has an opening above each of the tunnel oxide layers. Each floating gate comprises a first polysilicon layer and a second polysilicon layer. The first polysilicon layer is embedded within the opening. The second polysilicon layer is formed over a portion of the first polysilicon layer and is electrically connected with the first polysilicon layer. The second dielectric layer is formed on the upper surface of the floating gate and the control gate is formed over the second dielectric layer.

Instead of forming a thermally grown oxide layer, the dielectric layer deposited around the first polysilicon layer serves as an insulation layer above the buried source/drain regions. Hence, unevenness of the insulation layer above the buried source/drain region is prevented. In addition, thickness of the buried source/drain regions and channel length underneath each stacked gate in each semiconductor chip can be accurately controlled. Consequently, reliability problems caused by device miniaturization can be avoided.

Furthermore, the opening in the dielectric layer creates a concave three-dimensional structure for the floating gate so that a subsequently formed control gate can have a greater contact area. Hence, the gate-coupling ratio (GCR) of the semiconductor device is increased and ultimately the electrical characteristic of the semiconductor product is improved.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

FIG. 2F is the final structure of the non-volatile memory unit, FIG. 3F is the final structure of the non-volatile memory unit.

DESCRIPTION OF THE PREFERRED EMBODIMENTS

Figure 1A:
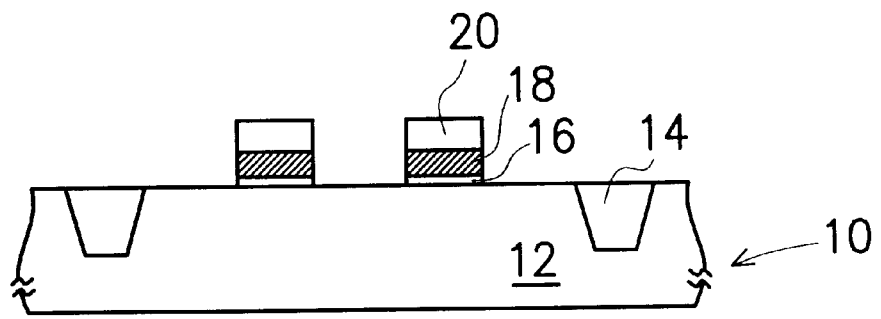
FIGS. 1A through 1D are schematic cross-sectional views showing the progression of steps for forming the stacked gate of a conventional twin cell non-volatile memory unit.
Figure 1B:
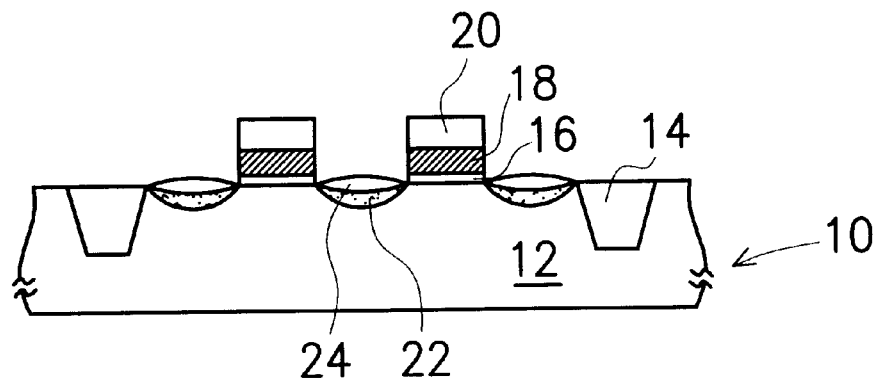
Figure 1C:
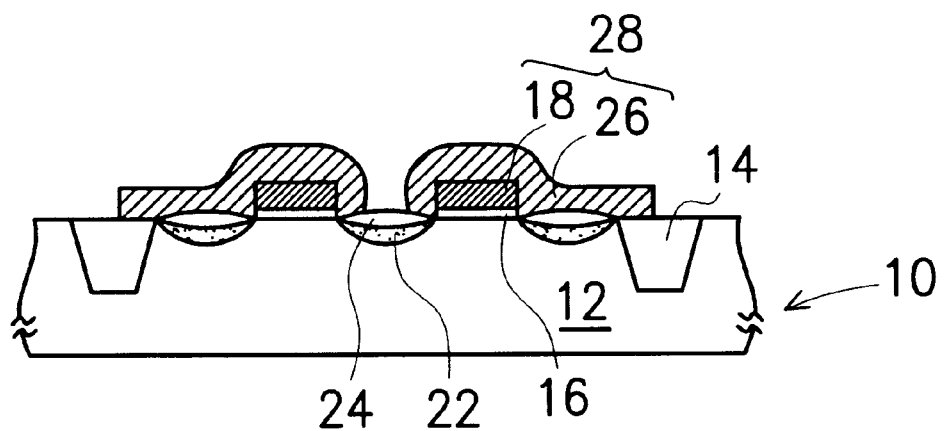
Figure 1D:
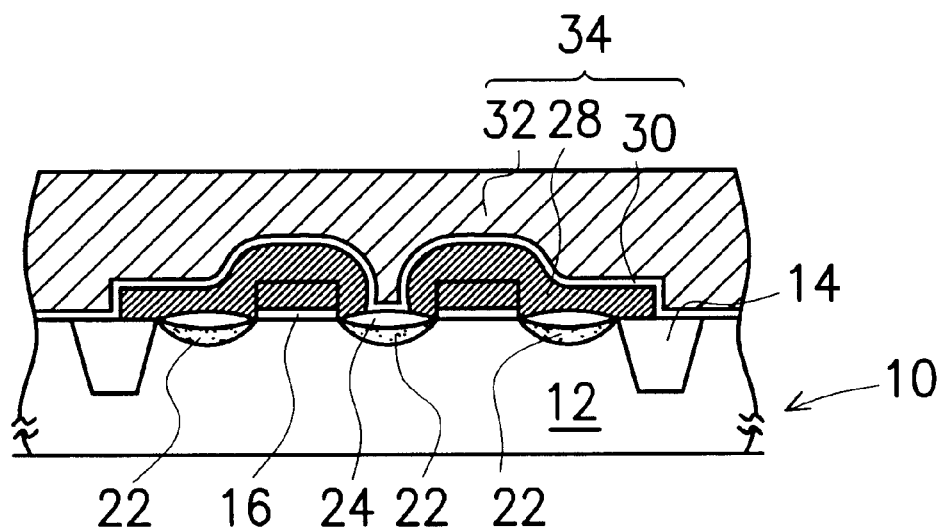

Reference will now be made in detail to the present preferred embodiments of the invention, examples of which are illustrated in the accompanying drawings. Wherever possible, the same reference numbers are used in the drawings and the description to refer to the same or like parts.

Figure 2A:
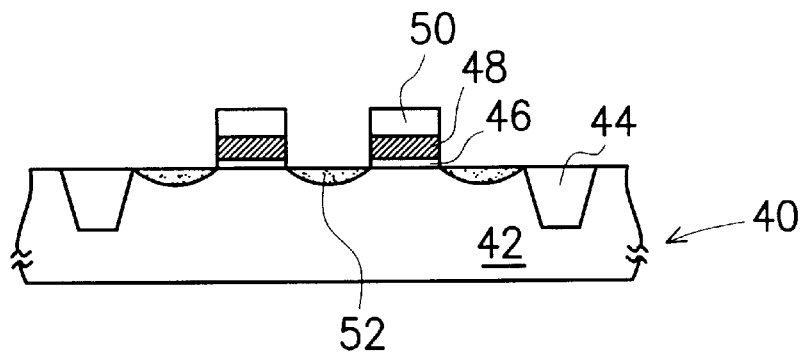
FIGS. 2A through 2F are schematic cross-sectional views showing the progression of steps for forming a non-volatile memory unit according to a first preferred embodiment of this invention.

FIGS. 2A through 2F are schematic cross-sectional views showing the progression of steps for forming a non-volatile memory unit according to a first preferred embodiment of this invention. As shown in FIG. 2A, a semiconductor chip 40 having a substrate 42 thereon is provided. The substrate 42 has a plurality of shallow trench isolation (STI) structures 44 therein. A thermal oxide layer (not shown), a polysilicon layer (not shown) and a sacrificial layer (not shown) are sequentially formed over the substrate 42. The polysilicon layer is formed, for example, by chemical vapor deposition. The sacrificial layer can be a silicon nitride layer formed, for example, by chemical vapor deposition. Photolithographic and etching processes are conducted to form a pair of tunnel oxide layers 46, a pair of first polysilicon layers 48 and a pair of sacrificial layers 50 between two shallow trench isolation (STI) layers 44. Thereafter, a plurality of doped regions 52 are formed in the substrate 42 on each side of the first polysilicon layers 48 to serve as source and drain terminals of a twin-cell unit.

Figure 2B:
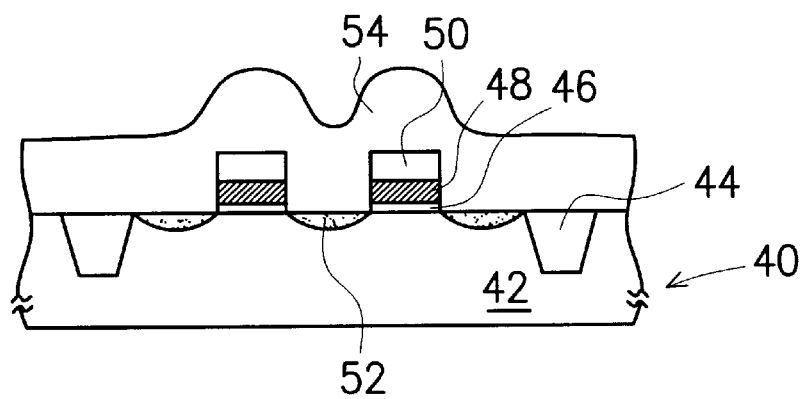

As shown in FIG. 2B, a dielectric layer 54 is formed over the semiconductor chip 40. The dielectric layer 54 covers both the substrate 42 and the sacrificial layer 50. The upper surface of the dielectric layer 54 in the substrate region is higher than the upper surface of the sacrificial layer 50. The dielectric layer 54 can be a silicon oxide layer formed, for example, by high-density plasma chemical vapor deposition (HDP-CVD).

Figure 2C:
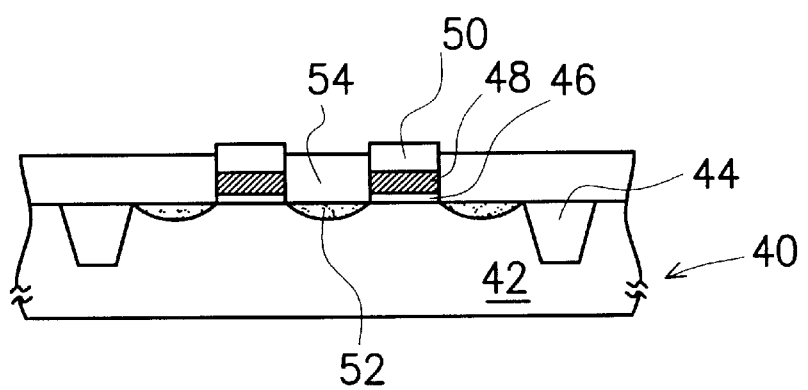

As shown in FIG. 2C, the dielectric layer 54 above the sacrificial layer 50 is completely removed and the dielectric layer 54 over the substrate 42 is trimmed down to a pre-determined thickness. The dielectric layer 54 is removed by chemical-mechanical polishing (CMP), for example.

Figure 2D:
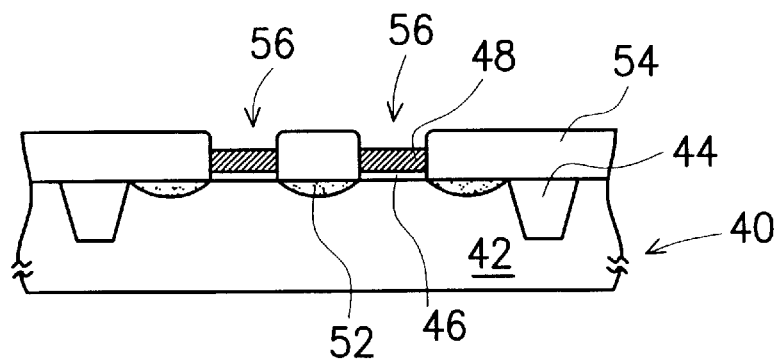

As shown in FIG. 2D, the sacrificial layer 50 above the first polysilicon layer 48 is completely removed so that the upper surface of the first polysilicon layer 48 and surrounding dielectric layer 54 together forms an opening 56. The sacrificial layer 50 is removed by anisotropic etching, for example.

Figure 2E:
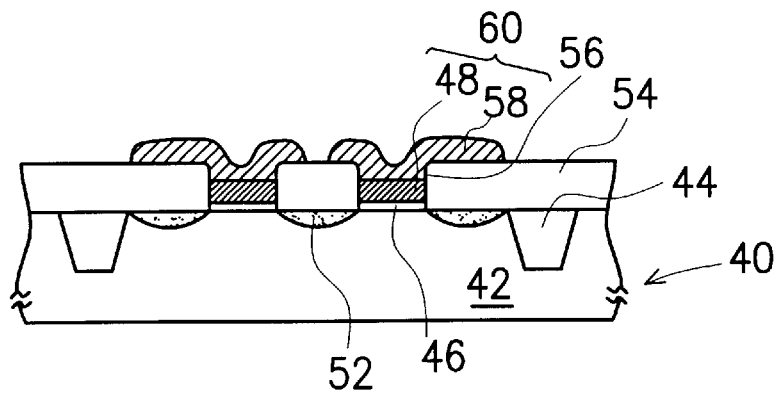

As shown in FIG. 2E, a conformal second polysilicon layer 58 is formed over the semiconductor chip 40 at specified regions. Hence, the openings 56 are completely filled and the second polysilicon layer 58 and the first polysilicon layer 48 are electrically connected to form a three-dimensional floating gate structure 60. The second polysilicon layer 58 is formed by chemical vapor deposition, for example. The dielectric layer 54 on each side of the first polysilicon layer 48 covers the source terminal and the rain terminal 52, thereby forming buried source/drain terminals.

Figure 2F:
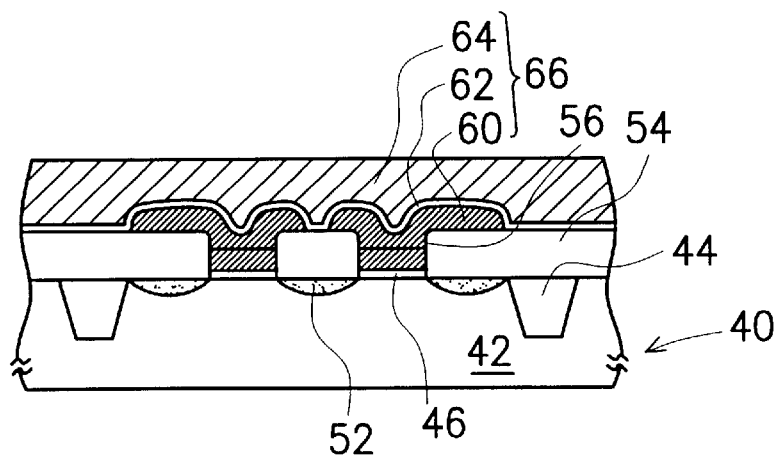

As shown in FIG. 2F, an oxide-nitride-oxide (ONO) dielectric layer 62 is formed over the silicon substrate 42. The ONO dielectric layer 62 is a composite layer formed by chemical vapor deposition, for example. Finally, a polysilicon control gate 64 is formed over the semiconductor chip 40. The floating gate 60, the ONO dielectric layer 62 and the control gate 64 together form the stacked gate 66 of a non-volatile memory unit. The two floating gates 60 between the STI layers 44 are the storage units of the twin-cell.

Figure 3A:
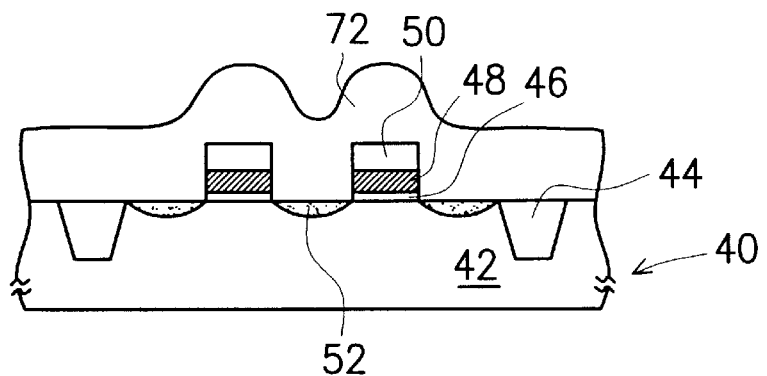
FIGS. 3A through 3F are schematic cross-sectional views showing the progression of steps for forming a non-volatile memory unit according to a second preferred embodiment of this invention.

FIGS. 3A through 3F are schematic cross-sectional views showing the progression of steps for forming a non-volatile memory unit according to a second preferred embodiment of this invention. As shown in FIG. 3A, a tunnel oxide layer 46, a first polysilicon layer 48 and a sacrificial layer 50 are sequentially formed over a substrate 42. A dielectric layer 72 is formed over the substrate 42 covering the sacrificial layer 50. The upper surface of the dielectric layer 72 in the substrate region is higher than the upper surface of the first polysilicon layer 48 but is not higher than the upper surface of the sacrificial layer 50. The dielectric layer 72 can be a silicon dioxide layer formed, for example, by high-density plasma chemical vapor deposition (HDP-CVD).

Figure 3B:
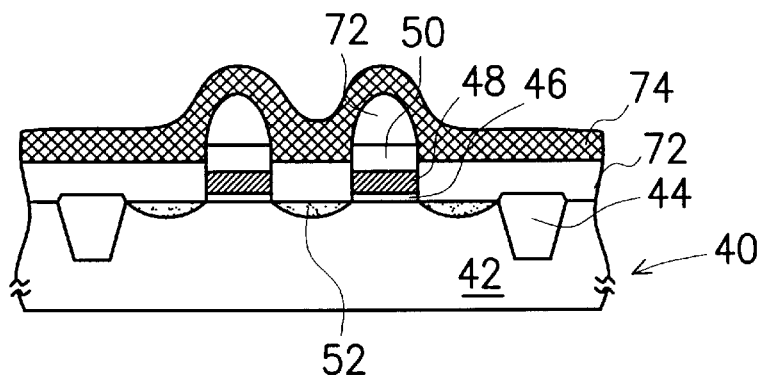

As shown in FIG. 3B, a portion of the dielectric layer 72 is removed to expose the side edge portion of the sacrificial layer 50. The dielectric layer is removed, for example, with dilute hydrofluoric acid solution or buffered oxide etchant (BOE) in a wet etching process. A passivation layer 74 is formed over the dielectric layer 72 such that the passivation layer 74 and the side edge portion of the sacrificial layer 50 are connected. The passivation layer can be a silicon nitride layer formed, for example, by chemical vapor deposition.

Figure 3C:
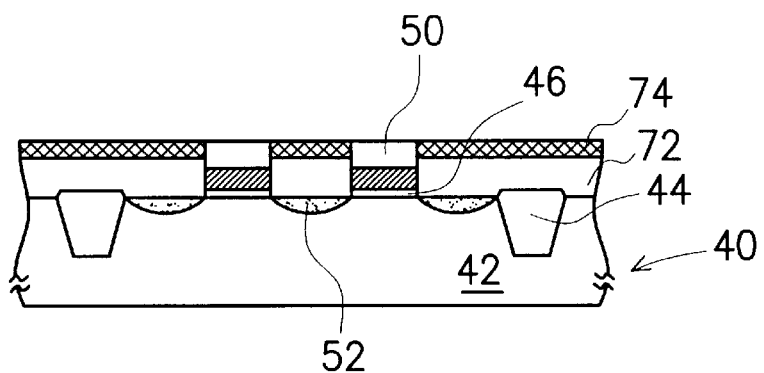

As shown in FIG. 3C, the dielectric layer 72 above the sacrificial layer 50 is completely removed while a portion of the passivation layer 74 is removed, for example, by chemical-mechanical polishing (CMP).

Figure 3D:
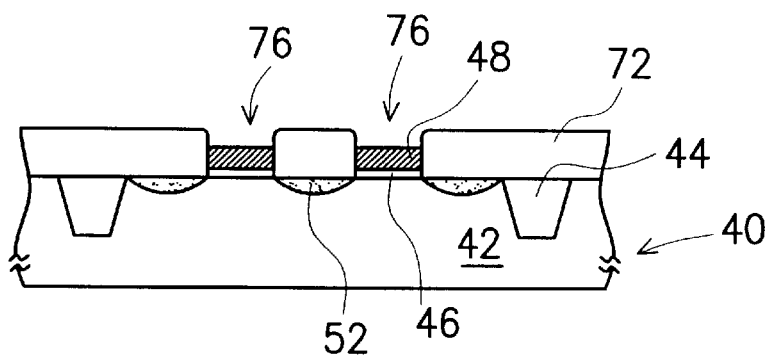

As shown in FIG. 3D, the passivation layer 74 and the sacrificial layer 50 over the first polysilicon layer 48 are removed. Therefore, the upper surface of the first polysilicon layer 48 and the surrounding dielectric layer 72 together form an opening 76. The passivation layer 74 and the sacrificial layer 50 are removed, for example, by hot phosphoric acid in wet etching.

Figure 3E:
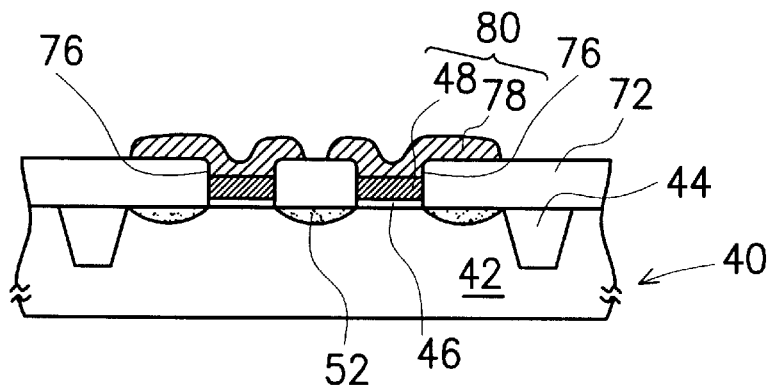

As shown in FIG. 3E, a conformal second polysilicon layer 78 is formed over the substrate 42 at specified regions. Thus, the openings 76 are completely filled and the second polysilicon layer 78 and the first polysilicon layer 48 are electrically connected to form a three-dimensional floating gate structure 80. The second polysilicon layer 78 is formed by chemical vapor deposition, for example.

Figure 3F:
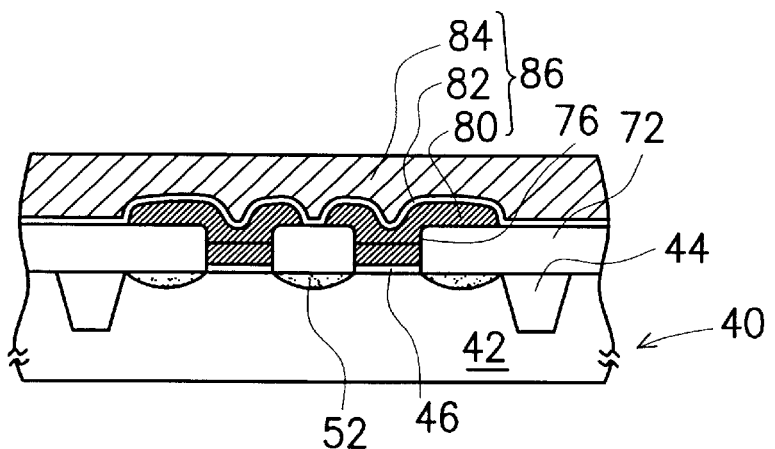

As shown in FIG. 3F, an oxide-nitride-oxide (ONO) dielectric layer 82 is formed over the silicon substrate 42.

The ONO dielectric layer 82 is a composite layer formed by chemical vapor deposition, for example. Finally, a polysilicon control gate 84 is formed over the semiconductor chip 40. The floating gate 80, the ONO dielectric layer 82 and the control gate 84 together form the stacked gate 86 of a non-volatile memory unit. The two floating gates 80 between the STI layers 44 are the storage units of the twin-cell.

In the second embodiment, wet etching is performed to remove the dielectric layer 72 near the upper side edge portion of the sacrificial layer 50 before forming the passivation layer 74 over the dielectric layer 72. Hence, when chemical-mechanical polishing is conducted in a subsequent process, the passivation layer 74 can effectively prevent the over-polishing of portions of the upper surface of the semiconductor chip 40. Ultimately, thickness variation of the dielectric layer 72 around the first polysilicon layer 48 due to an uneven polished surface is avoided. In other words, the isolation layer above the buried source/drain terminals has a uniform thickness. Furthermore, the passivation layer 74 also protects the dielectric layer 72 against any contamination by metallic contaminants inside slurry during a CMP operation.

In this invention, HDP-CVD is conducted to form a dielectric layer around the first polysilicon layer that serves as an insulation layer for the buried source/drain terminals. Since the oxide layer is not formed by thermal oxidation, buried source/drain terminals can have a uniform thickness without any over-diffusion. Consequently, all twin-cell units can have almost identical electrical properties.

This invention also utilizes CMP to planarize the dielectric layer 54 around the first polysilicon layer 48 before removing the sacrificial layer 50 above the first polysilicon layer 48 by etching to form the opening 56. Therefore, after forming the conformal second polysilicon layer 58 above the first polysilicon layer 48, the floating gate 60 surface forms a three-dimensional structure. Ultimately, area for forming the control gate 64 is increased. Hence, the gate-coupling ratio of the stacked gate 66 can be increased by up to 65% to 70%, which has great benefits for most semiconductor products.

In the second embodiment of this invention, the passivation layer 74 is formed over the dielectric layer 72 before conducting the CMP so that thickness of the dielectric layer 72 around the first polysilicon layer can be accurately controlled. The passivation layer 74 is further capable of preventing any contaminant particles from contaminating the buried source/drain terminals during CMP.

In addition, besides non-volatile memory, the three-dimensional stacked gate structure fabricated according to this invention can also be used to fabricate embedded flash memory as well.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A non-volatile memory structure having a high gate coupling ratio, comprising:
   a substrate,
   a pair of isolation layers embedded within the substrate;
   a pair of tunnel oxide layers on an upper surface of the substrate between the isolation layers;
   a buried source/drain region in the substrate between the isolation layer and the tunnel oxide layer,
   a first dielectric layer over the substrate covering the buried source/drain region and having an opening above each tunnel oxide layer;
   a pair of floating gates each comprising a first polysilicon layer and a second polysilicon layer, wherein the first polysilicon layer is located within the opening and the second polysilicon is located over the first polysilicon layer, and wherein the first polysilicon layer and the second polysilicon layer are electrically connected;
   a second dielectric layer over each floating gate surface; and
   a control gate over the second dielectric layer.

2. The structure of claim 1, wherein the first dielectric layer includes a silicon oxide layer.

3. The structure of claim 1, wherein the second dielectric layer includes an oxide-nitride-oxide composite layer.

4. The structure of claim 1, wherein the control gate includes polysilicon.

5. The structure of claim 1, wherein the isolation layers include a shallow trench isolation layer.

6. A non-volatile memory structure having a high gate coupling ratio, comprising:
   a substrate;
   a pair of isolation layers embedded within the substrate;
   a pair of tunnel oxide layers on an upper surface of the substrate between the isolation layers;
   a buried source/drain region in the substrate between the isolation layer and the tunnel oxide layer;
   a first dielectric layer over the substrate covering the buried source/drain region and having an opening above each tunnel oxide layer;
   a pair of floating gates within the opening and over a section of the first dielectric layer, wherein a three-dimensional structure is produced thereby;
   a pair of dielectric layers over the floating gates; and
   a control gate over the second dielectric layers and the first dielectric layers.

7. The structure of claim 6, wherein the first dielectric layer includes a silicon oxide layer.

8. The structure of claim 6, wherein the floating gate comprises an electrically connected first polysilicon layer and a second polysilicon layer, wherein that the first polysilicon layer is above the tunnel oxide layer and the second polysilicon layer covers a portion of the first dielectric layer.

9. The structure of claim 6, wherein the second dielectric layer includes an oxide-nitride-oxide composite layer.

10. The structure of claim 6, wherein the control gate includes polysilicon.

11. The structure of claim 6, wherein the isolation layers include a shallow trench isolation layer.

* * * * *